United States Patent
Hashimoto

(10) Patent No.: US 7,463,063 B2
(45) Date of Patent: Dec. 9, 2008

(54) SEMICONDUCTOR DEVICE

(75) Inventor: Yoshinori Hashimoto, Osaka (JP)

(73) Assignee: Sharp Kabushiki Kaisha, Oska-shi (JP)

( * ) Notice: Subject to any disclaimer, the term of this patent is extended or adjusted under 35 U.S.C. 154(b) by 0 days.

(21) Appl. No.: 11/802,368

(22) Filed: May 22, 2007

(65) Prior Publication Data
US 2007/0290718 A1 Dec. 20, 2007

(30) Foreign Application Priority Data
May 23, 2006 (JP) ............... 2006-142393

(51) Int. Cl.
H03K 19/00 (2006.01)
H03K 19/02 (2006.01)
H03K 19/0175 (2006.01)

(52) U.S. Cl. ............... 326/57; 326/16; 326/86
(58) Field of Classification Search ........... 326/16, 326/56–58, 82, 83, 86, 87; 327/108, 109, 327/333
See application file for complete search history.

(56) References Cited

U.S. PATENT DOCUMENTS

| | | | | |
|---|---|---|---|---|
| 5,043,944 A | * | 8/1991 | Nakamura et al. | 365/189.05 |
| 5,087,840 A | * | 2/1992 | Davies et al. | 326/83 |
| 5,822,254 A | * | 10/1998 | Koshikawa et al. | 365/189.05 |
| 5,903,197 A | * | 5/1999 | Kikugawa | 331/17 |
| 6,310,493 B1 | * | 10/2001 | Taniguchi | 326/81 |
| 6,323,687 B1 | * | 11/2001 | Yano | 326/83 |
| 6,346,828 B1 | * | 2/2002 | Rosen et al. | 326/56 |
| 7,053,680 B2 | * | 5/2006 | Masleid et al. | 327/112 |

FOREIGN PATENT DOCUMENTS

| | | |
|---|---|---|
| JP | 2-232577 A | 9/1990 |
| JP | 4-373310 A | 12/1992 |
| JP | 8-162937 A | 6/1996 |

* cited by examiner

Primary Examiner—James H. Cho
Assistant Examiner—Dylan White
(74) Attorney, Agent, or Firm—Birch, Stewart, Kolasch & Birch, LLP

(57) ABSTRACT

In normal operation, an internal circuit operates in synchronism with a clock CK, so that switching operation of the output circuit is performed based on inputted data and an output enable signal. At this point, an output from the internal circuit to a three-state control circuit is forcedly set by state control circuits, whereby different test operations are performed on the output circuit.

12 Claims, 4 Drawing Sheets

SEMICONDUCTOR DEVICE

This nonprovisional application claims priority under 35 U.S.C. § 119(a) on Patent Application No. 2006-142393 filed in Japan on May 23, 2006, the entire contents of which are hereby incorporated by reference.

BACKGROUND OF THE INVENTION

1. Field of the Invention

The present invention relates to semiconductor devices, such as microcomputers, that are provided with an output circuit. More particularly, the present invention relates to a semiconductor device for use in apparatus that perform high-speed data processing such as wireless communication.

2. Description of Related Art

Since a signal obtained by data processing performed in semiconductor devices, such as microcomputers, that are used in various types of apparatus is weak, an output circuit is provided therein for amplifying that weak signal and outputting it. In the semiconductor devices provided with such an output circuit, different tests are conducted for checking the state of the output circuit. Some examples of such tests are a function test for checking whether or not a desired output can be obtained from the output circuit by operating the semiconductor device, an output current test for checking the level of a current that flows through the output circuit when one of the elements constituting it is forced ON, and an output leakage current test for checking the level of a current that leaks from the output circuit when all the elements constituting it are forced OFF.

Conventionally, semiconductor devices provided with a logic circuit for test control have been adopted so that the above-described different tests on the output circuit are conducted by inputting instruction signals indicating the execution of those tests. For example, according to a semiconductor device disclosed in JP-A-H02-232577, a test control signal generation circuit is provided that generates a test control signal from a test control input signal and provides it to different output circuits. With this configuration, a logic circuit that judges which test is required is provided in each output circuit, and, since the test control signal generated from the test control input signal is inputted thereto, it is possible to simplify the logic circuit provided in each output circuit.

Moreover, according to a semiconductor device disclosed in JP-A-H04-373310, an output buffer circuit is formed by connecting two circuits, each composed of serially connected P-channel MOS transistor and N-channel MOS transistor, in parallel, so that a malfunction in the tester caused by switching noise is prevented by using one of two P-channel MOS transistors or one of two N-channel MOS transistors when a function test is conducted. Here, a logic circuit for switching between a function test and normal operation is provided in a stage preceding the output buffer circuit.

Furthermore, according to a semiconductor device disclosed in JP-A-H08-162937, as is the case with the semiconductor device disclosed in JP-A-H04-373310, two circuits, each composed of serially connected P-channel MOS transistor and N-channel MOS transistor, are connected in parallel. The semiconductor device disclosed in JP-A-H08-162937 differs from the semiconductor device disclosed in JP-A-H04-373310 in that the two P-channel MOS transistors and the two N-channel MOS transistors are used when different tests are conducted, whereby a current driving capability thereof is enhanced and the tests can be conducted efficiently. Here, a logic circuit for switching between different tests and normal operation is provided in a stage preceding the output circuit built with the P-channel MOS transistors and the N-channel MOS transistors.

An example of the configuration of a conventional semiconductor device having the function of conducting different tests is shown in FIG. 6. The semiconductor device having the configuration shown in FIG. 6 includes an internal circuit 101 to which data is inputted, a state control circuit 102 to which data processed by the internal circuit 101 is fed, and an output circuit 2 that produces, through an output terminal 1, an output at a high, low, or high-impedance level according to the output of the state control circuit 102. To the state control circuit 102, signals PTEST, NTEST, and HIZ for fixing the output circuit 2 in high, low, and high-impedance states, respectively, and a signal TEST for executing a test function are inputted.

In the semiconductor device configured as described above, when the signal TEST is inputted, the state control circuit 102 is set so as to execute a test function. When the signal PTEST is inputted, control is performed by the state control circuit 102 in such a way that an output signal at a high level is forced to be outputted from the output circuit 2 regardless of the output of the internal circuit 101. Similarly, when the signal NTEST or the signal HiZ is inputted, control is performed by the state control circuit 102 in such a way that an output signal at a low or high-impedance level is forced to be outputted from the output circuit 2 regardless of the output of the internal circuit 101.

In recent years, with an increase in the data processing capacity of wireless communication apparatus or the like, a higher data transfer speed thereof is required. It is for this reason that semiconductor devices, such as microcomputers, incorporated in such apparatus are required to have an enhanced processing capability and output an output signal at higher speed. Some semiconductor devices required to realize such speeding up operate at a frequency of more than 100 MHz (in terms of access speed, less than 10 nanoseconds).

Incidentally, the conventional semiconductor device requires a test circuit for conducting different tests on the output circuit, and therefore an attempt is made to reduce the time and cost of the tests performed by the test circuit. However, as disclosed in JP-A-H02-232577, JP-A-H04-373310, and JP-A-H08-162937, since the test circuit provided in the semiconductor device is built with logic circuits directly inserted in the output circuit, an extra gate delay is undesirably added to the output signal in normal operation by the logic circuits constituting the test circuit.

That is, in the semiconductor device configured as shown in FIG. 6, the state control circuit 102 is needed to achieve a test function and is provided separately from the internal circuit 101. Thus, in a case where this conventional semiconductor device is used, it is necessary to provide logic circuits inside it for performing a calculation operation on different signals by which the test circuit such as the state control circuit 102 achieves a test function. As a result, the test circuit such as the state control circuit 102 is affected by a gate delay produced by the logic circuits provided for achieving a test function. This undesirably hampers the speeding-up of data output.

In view of the conventionally experienced problems described above, an object of the present invention is to provide semiconductor devices provided with an output circuit that can conduct different tests without the need of directly inserting a test circuit in a path along which an output signal is transmitted.

SUMMARY OF THE INVENTION

To achieve the above object, according to one aspect of the present invention, a semiconductor device is provided with: an output circuit that is built with a first switching element and a second switching element that are connected in series between a first direct-current voltage and a second direct-current voltage; an output terminal that is connected to a node at which the first and second switching elements are connected together; an internal circuit that produces data in the form of binary data that shifts between a first signal level and a second signal level; a first control circuit that performs switching control of the first and second switching elements of the output circuit according to the data inputted from the internal circuit; and a second control circuit to which a first control signal by which only the first switching element is forced ON by the first control circuit and a second control signal by which only the second switching element is forced ON by the first control circuit are inputted, the second control circuit that forcedly sets, according to the first and second control signals, the signal level of the data to be outputted from the internal circuit. Here, when the data is at the first signal level, the first switching element is turned ON and the first direct-current voltage appears at the output terminal; when the data is at the second signal level, the second switching element is turned ON and the second direct-current voltage appears at the output terminal. When the first control signal is inputted to the second control circuit, the data that has been forced to be at the first signal level is outputted from the internal circuit to the first control circuit; when the second control signal is inputted to the second control circuit, the data that has been forced to be at the second signal level is outputted from the internal circuit to the first control circuit.

According to the present invention, the levels of data and a fourth control signal outputted from the internal circuit are each forcedly set to a predetermined level by the second or third control circuit. This helps achieve a configuration that simply requires the first control circuit to be provided between the internal circuit and the output circuit. As a result, unlike the conventional example, the first control circuit does not need a logic element for checking which test function is instructed, making it possible to reduce the number of logic elements thereof. This contributes to a reduction of the number of stages of logic elements provided between the internal circuit and the output circuit, and accordingly makes it possible to reduce a delay produced by the logic element and achieve a high-speed data output from the internal circuit. In addition, the first and second control signals fed to the second control circuit make it easy to conduct an output current test on the first and second switching elements. Furthermore, the fifth control signal fed to the third control circuit makes it easy to conduct an output leakage current test when the first and second switching elements are turned OFF.

DETAILED DESCRIPTION OF PREFERRED EMBODIMENTS

Figure 1:
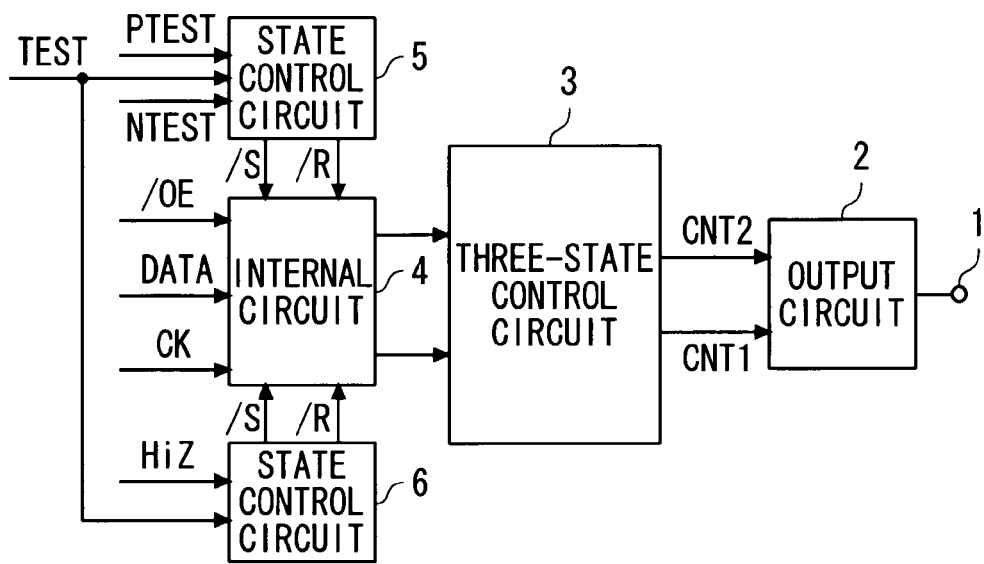
FIG. 1 is a block diagram showing the internal configuration of a semiconductor device embodying the present invention.

Hereinafter, an embodiment of the present invention will be described with reference to the drawings. FIG. 1 is a block diagram showing the configuration of a semiconductor device of this embodiment.

Internal Configuration of the Semiconductor Device

As shown in FIG. 1, the semiconductor device of this embodiment includes: an output terminal 1 from which a signal is outputted to the outside, an output circuit 2 that determines the level of an output signal outputted from the output terminal 1; a three-state control circuit 3 that sets the operating state of the output circuit 2 in three states, namely high, low, and high-impedance states; an internal circuit 4 that performs data processing for producing data to be fed to the output circuit 2 via the three-state control circuit 3; and state control circuits 5 and 6 that perform switching of the operating state of the three-state control circuit 3 by feeding a signal to the internal circuit 4.

In the semiconductor device configured as shown in FIG. 1, the internal circuit 4 operates in synchronism with a clock CK, and performs a calculation operation on data inputted from outside. The resultant processed data is latched in the internal circuit 4, and is then fed to the three-state control circuit 3. To the internal circuit 4 that performs a calculation operation on data in the above-described manner, an output enable signal bar OE (hereinafter /OE) indicating whether an output operation of the output circuit 2 is enabled or disabled is fed. The output enable signal /OE is latched in the internal circuit 4, and is then fed to the three-state control circuit 3.

The state control circuit 5 gives an instruction to the internal circuit 4, so that operation of the three-state control circuit 3 is controlled in such a way that an output current test is conducted in which the output of the output circuit 2 is fixed to a high or low level for measuring an output current. Similarly, the state control circuit 6 gives an instruction to the internal circuit 4, so that operation of the three-state control circuit 3 is controlled in such a way that an output leakage current test is conducted in which the output of the output circuit 2 is fixed to a high-impedance level for measuring a leakage current of the output circuit 2.

In the semiconductor device configured as described above, a clock CK is fed to the internal circuit 4, and the internal circuit 4 performs processing in synchronism with the clock CK. Furthermore, a signal TEST for indicating switching between a test operation and normal operation is fed to the state control circuits 5 and 6, a signal PTEST for fixing the output circuit 2 to a high state and a signal NTEST for fixing the output circuit 2 to a low state are fed to the state control circuit 5, and a signal HiZ for fixing the output circuit 2 to a high-impedance state is fed to the state control circuit 6.

Output Circuit

Figure 2:
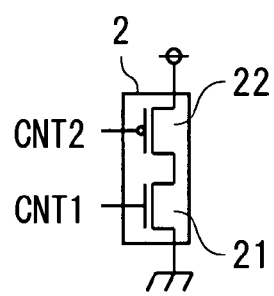
FIG. 2 is a circuit diagram showing the configuration of an output circuit provided in the semiconductor device of FIG. 1.

The configuration of the output circuit 2 of the semiconductor device configured as shown in FIG. 1 will be described with reference to FIG. 2. As shown in FIG. 2, the output circuit 2 is composed of an N-channel MOS transistor 21 whose source is grounded and a P-channel MOS transistor 22 having a source to which a power supply potential is supplied. The drains of the MOS transistors 21 and 22 are connected to the output terminal 1. Control signals CNT1 and CNT2 outputted from the three-state control circuit 3 are fed to the gates of the MOS transistors 21 and 22, respectively. The control signal CNT1 controls ON/OFF of the MOS transistor 21, and the control signal CNT2 controls ON/OFF of the MOS transistor 22.

As a result of the output circuit 2 being configured as described above, when both the control signals CNT1 and CNT2 from the three-state control circuit 3 turn to a low level, only the MOS transistor 22 to which the control signal CNT2 is inputted is turned ON, whereby the output terminal 1 is at the power supply potential, and the output signal outputted therefrom turns to a high level. When both the control signals CNT1 and CNT2 from the three-state control circuit 3 turn to a high level, only the MOS transistor 21 to which the control signal CNT1 is inputted is turned ON, whereby the output terminal 1 is at the ground potential, and the output signal outputted therefrom turns to a low level. When the control signals CNT1 and CNT2 from the three-state control circuit 3 turn to a low level and to a high level, respectively, both the MOS transistors 21 and 22 are turned OFF, whereby the output terminal 1 is at the floating potential, and the output signal outputted therefrom turns to a high-impedance level.

Internal Circuit and State Control Circuit

How part of the internal circuit 4 and the state control circuits 5 and 6 are configured in the semiconductor device having the configuration shown in FIG. 1 will be described with reference to FIG. 3.

Figure 3:
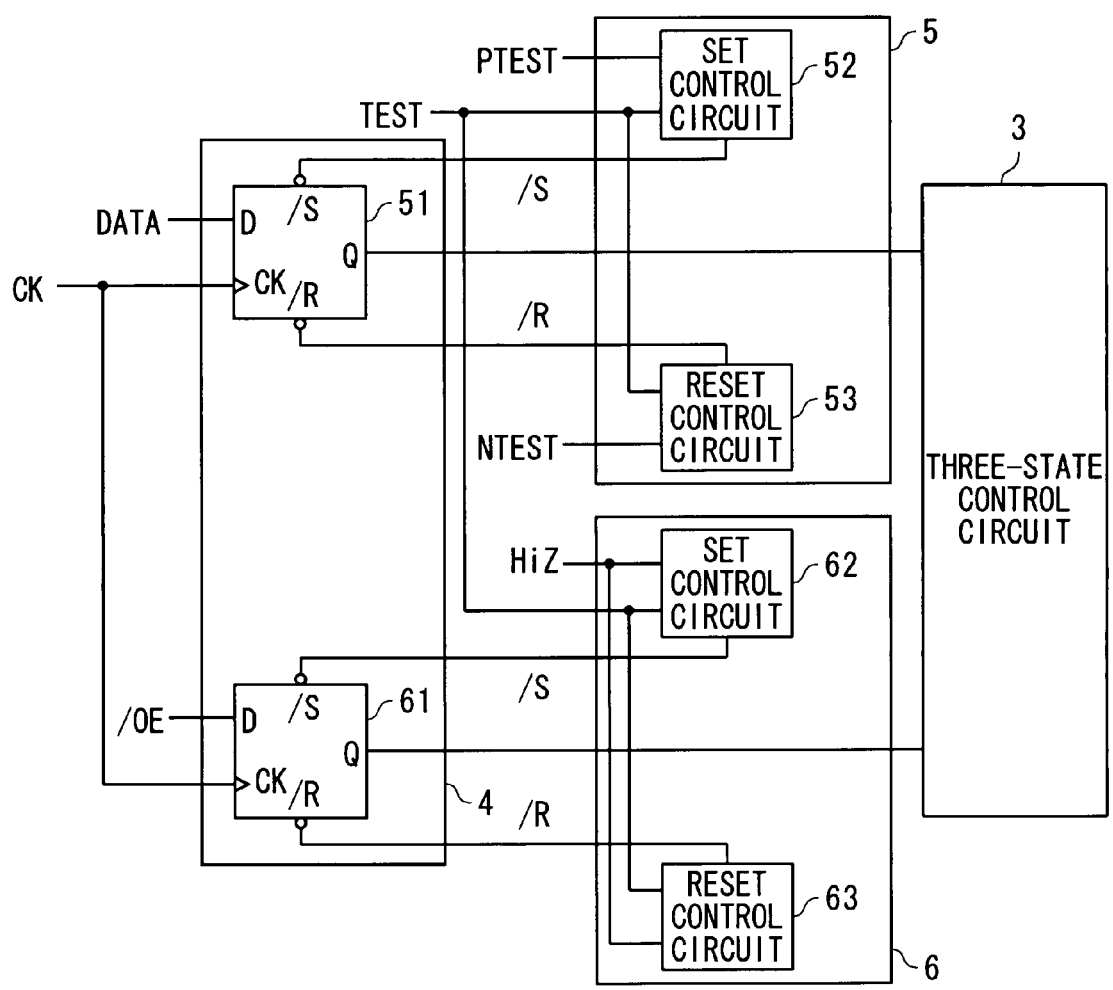
FIG. 3 is a block diagram showing part of an internal circuit provided in the semiconductor device of FIG. 1 and the configuration of a state control circuit provided in the same semiconductor device.

As shown in FIG. 3, the internal circuit 4 includes: a D flip-flop 51 having an input terminal (a D terminal) to which data is inputted; and a D flip-flop 61 having an input terminal (a D terminal) to which the output enable signal /OE is inputted. Incidentally, the output enable signal /OE at a low level indicates that an output operation of the output circuit 2 is enabled; the output enable signal /OE at a high level indicates that the output operation of the output circuit 2 is disabled. The D flip-flops 51 and 61 each have a set terminal (an S bar terminal; hereinafter a /S terminal) and a reset terminal (an R bar terminal; hereinafter a /R terminal), of which each is built with an inverting input terminal, and have a clock terminal (a CK terminal) to which a clock CK is inputted and an output terminal (a Q terminal) from which an output is provided to the three-state control circuit 3.

The state control circuit 5 includes: a set control circuit 52 that receives the signals TEST and PTEST and thereby produces an output to the /S terminal of the D flip-flop 51; and a reset control circuit 53 that receives the signals TEST and NTEST and thereby produces an output to the /R terminal of the D flip-flop 51. As shown in FIG. 3, the state control circuit 6 includes: a set control circuit 62 that receives the signals TEST and HiZ and thereby produces an output to the /S terminal of the D flip-flop 61; and a reset control circuit 63 that receives the signals TEST and HiZ and thereby produces an output to the /R terminal of the D flip-flop 61.

In this way, the state control circuits 5 and 6 are configured. In the state control circuit 5, when both the signals TEST and PTEST turn to a high level, the set control circuit 52 inputs a low level to the /S terminal of the D flip-flop 51, so that the Q terminal of the D flip-flop 51 is forced high. On the other hand, when both the signals TEST and NTEST turn to a high level, the reset control circuit 53 inputs a low level to the /R terminal of the D flip-flop 51, so that the Q terminal of the D flip-flop 51 is forced low.

In the state control circuit 6, when both the signals TEST and HiZ turn to a high level, the set control circuit 62 inputs a low level to the /S terminal of the D flip-flop 61, so that the Q terminal of the D flip-flop 61 is forced high. On the other hand, when the signal TEST turns to a high level and the signal HiZ turns to a low level, the reset control circuit 63 inputs a low level to the /R terminal of the D flip-flop 61, so that the Q terminal of the D flip-flop 61 is forced low.

Three-State Control Circuit

Hereinafter, the three-state control circuit 3 that determines the operation of the output circuit 2 based on the signal outputted from the internal circuit 4 described above will be described. When the output from the Q terminal of the D flip-flop 61 provided in the internal circuit 4 turns to a high level, regardless of the level of the output from the Q terminal of the D flip-flop 51 that is also provided in the internal circuit 4, the three-state control circuit 3 outputs, to the output circuit 2, a low-level control signal CNT1 and a high-level control signal CNT2.

On the other hand, when the output from the Q terminal of the D flip-flop 61 turns to a low level, the three-state control circuit 3 drives the output circuit 2 based on the output from the Q terminal of the D flip-flop 51. That is, when the output from the Q terminal of the D flip-flop 51 turns to a high level, the three-state control circuit 3 outputs low-level control signals CNT1 and CNT2 to the output circuit 2; when the output from the Q terminal of the D flip-flop 51 turns to a low level, it outputs high-level control signals CNT1 and CNT2 to the output circuit 2.

Normal Operation

In the following description, how the semiconductor device shown in FIG. 1 whose individual functional blocks are configured as described above operates when it is instructed to perform normal operation of the output circuit 2 will be explained. To perform the normal operation, the low-level signals TEST, NTEST, and PTEST are inputted to the state control circuit 5, and the low-level signals TEST and HiZ are inputted to the state control circuit 6.

Thus, in the state control circuit 5, since the low-level signals TEST and PTEST are inputted to the set control circuit 52, a high-level signal is outputted from the set control circuit 52; since the low-level signals TEST and NTEST are inputted to the reset control circuit 53, a high-level signal is outputted from the reset control circuit 53. As a result, a high-level signal is inputted to each of the /S terminal and the /R terminal of the D flip-flop 51 provided in the internal circuit 4. This makes the D flip-flop 51 retrieve data inputted to the D terminal thereof by synchronizing the clock CK inputted to the CK terminal thereof, and produce an output according to the retrieved data from the Q terminal thereof to the three-state control circuit 3.

In the state control circuit 6, since the low-level signals TEST and HiZ are inputted to the set control circuit 62 and to the reset control circuit 63, a high-level signal is outputted from the set control circuit 62 and the reset control circuit 63. As a result, a high-level signal is inputted to each of the /S terminal and the /R terminal of the D flip-flop 61 provided in the internal circuit 4. This makes the D flip-flop 61 retrieve the output enable signal /OE inputted to the D terminal thereof by synchronizing the clock CK inputted to the CK terminal thereof, and produce an output according to the retrieved output enable signal /OE from the Q terminal thereof to the three-state control circuit 3.

When the state control circuits 5 and 6 operate in this way, the operating states of the D flip-flops 51 and 61 provided in the internal circuit 4 are so set that the D flip-flops 51 and 61 are driven in synchronism with the clock CK and the inputs to the D terminals thereof are outputted from the Q terminals thereof. Thus, when the output enable signal /OE turns to a high level, a high-level output is fed from the D flip-flop 61 to the three-state control circuit 3. As a result, regardless of the level of the output of the D flip-flop 51, the control signals CNT1 and CNT2 outputted from the three-state control circuit 3 are fixed to a low level and to a high level, respectively. This keeps the MOS transistors 21 and 22 of the output circuit 2 OFF, making the output terminal 1 produce a high-impedance output.

When the output enable signal /OE turns to a low level, a low-level output is fed from the D flip-flop 61 to the three-state control circuit 3. When data given to the D flip-flop 51 provided in the internal circuit 4 is at a high level, a high-level output is fed from the D flip-flop 51 to the three-state control circuit 3. As a result, both the control signals CNT1 and CNT2 outputted from the three-state control circuit 3 turn to a low level. This turns the MOS transistor 22 ON and the MOS transistor 21 OFF in the output circuit 2, making the output terminal 1 produce a high-level output.

Furthermore, in a case where the data given to the D flip-flop 51 provided in the internal circuit 4 is at a low level when the output enable signal /OE turns to a low level, a low-level output is fed from the D flip-flop 51 to the three-state control circuit 3. As a result, both the control signals CNT1 and CNT2 outputted from the three-state control circuit 3 turn to a high level. This turns the MOS transistor 21 ON and the MOS transistor 22 OFF in the output circuit 2, making the output terminal 1 produce a low-level output.

Output Current Test on the N-Channel MOS Transistor

In the following description, how the semiconductor device shown in FIG. 1 whose individual functional blocks are configured as described above operates when it is instructed to conduct an output current test on the MOS transistor 21 will be explained. To conduct the output current test on the MOS transistor 21, the signals TEST and NTEST to be inputted to the state control circuit 5 are turned high and the signal PTEST to be inputted thereto is turned low, and the signals TEST and HiZ to be inputted to the state control circuit 6 are turned high and low, respectively.

Thus, in the state control circuit 5, since the high-level signals TEST and NTEST are inputted to the reset control circuit 53, a low-level signal is outputted from the reset control circuit 53; since the high-level signal TEST and the low-level signal PTEST are inputted to the set control circuit 52, a high-level signal is outputted from the set control circuit 52. As a result, a high-level signal and a low-level signal are inputted to the /S terminal and the /R terminal, respectively, of the D flip-flop 51 provided in the internal circuit 4. This brings the D flip-flop 51 into a reset state, whereby the output from the Q terminal of the D flip-flop 51 is forced low.

In the state control circuit 6, since the high-level signal TEST and the low-level signal HiZ are inputted to the set control circuit 62 and to the reset control circuit 63, respectively, a high-level signal is outputted from the set control circuit 62 and a low-level signal is outputted from the reset control circuit 63. As a result, a high-level signal and a low-level signal are inputted to the /S terminal and to the /R terminal, respectively, of the D flip-flop 61 provided in the internal circuit 4. This brings the D flip-flop 61 into a reset state, whereby the output from the Q terminal of the D flip-flop 61 is forced low.

As a result, low-level signals are fed to the three-state control circuit 3 from the Q terminals of the D flip-flops 51 and 61 provided in the internal circuit 4, making the control signals CNT1 and CNT2 outputted from the three-state control circuit 3 turn to a high level. This turns the MOS transistor 21 ON and the MOS transistor 22 OFF in the output circuit 2, whereby it is possible to measure the output current flowing through the N-channel MOS transistor 21 from the output terminal 1.

Output Current Test on the P-Channel MOS Transistor

In the following description, how the semiconductor device shown in FIG. 1 whose individual functional blocks are configured as described above operates when it is instructed to conduct an output current test on the MOS transistor 22 will be explained. To conduct the output current test on the MOS transistor 22, the signals TEST and PTEST to be inputted to the state control circuit 5 are turned high and the signal NTEST to be inputted thereto is turned low, and the signals TEST and HiZ to be inputted to the state control circuit 6 are turned high and low, respectively.

Thus, in the state control circuit 5, since the high-level signals TEST and PTEST are inputted to the set control circuit 52, a low-level signal is outputted from the set control circuit 52; since the high-level signal TEST and the low-level signal NTEST are inputted to the reset control circuit 53, a high-level signal is outputted from the reset control circuit 53. As a result, a low-level signal and a high-level signal are inputted to the /S terminal and to the /R terminal, respectively, of the D flip-flop 51 provided in the internal circuit 4. This brings the D flip-flop 51 into a set state, whereby the output from the Q terminal of the D flip-flop 51 is forced high.

On the other hand, as in the case where it is instructed to conduct the output current test on the N-channel MOS transistor, since the high-level signal TEST and the low-level signal HiZ are inputted to the state control circuit 6, the D flip-flop 61 provided in the internal circuit 4 is brought into a reset state, whereby the output from the Q terminal of the D flip-flop 61 is forced low.

As a result, the three-state control circuit 3 is fed with a high-level signal outputted from the Q terminal of the D flip-flop 51 and a low-level signal outputted from the Q terminal of the D flip-flop 61, the D flip-flops 51 and 61 being provided in the internal circuit 4, making both the control signals CNT1 and CNT2 outputted from the three-state control circuit 3 turn to a low level. This turns the MOS transistor 22 ON and the MOS transistor 21 OFF in the output circuit 2, whereby it is possible to measure the output current flowing through the P-channel MOS transistor 22 from the output terminal 1.

Output Leakage Current Test

In the following description, how the semiconductor device shown in Fig; 1 whose individual functional blocks are configured as described above operates when it is instructed to conduct an output leakage current test on the output circuit 2 will be explained. To conduct the output leakage current test, the signals TEST and HiZ to be inputted to the state control circuit 6 are turned high.

Thus, in the state control circuit 6, since the high-level signals TEST and HiZ are inputted to each of the set control circuit 62 and the reset control circuit 63, a low-level signal is outputted from the set control circuit 62 and a high-level signal is outputted from the reset control circuit 63. As a result, a low-level signal and a high-level signal are inputted to the /S terminal and to the /R terminal, respectively, of the D flip-flop 61 provided in the internal circuit 4. This brings the D flip-flop 61 into a set state, whereby the output from the Q terminal of the D flip-flop 61 is forced high.

As a result, a high-level signal is fed to the three-state control circuit 3 from the Q terminal of the D flip-flop 61 provided in the internal circuit 4. As a result, regardless of the level of the output of the D flip-flop 51 provided in the internal circuit 4, the control signals CNT1 and CNT2 outputted from the three-state control circuit 3 are fixed to a low level and to a high level, respectively. This turns off the MOS transistors 21 and 22 of the output circuit 2, whereby it is possible to measure the output leakage current flowing into the MOS transistor 21 or flowing out of the MOS transistor 22 via the output terminal 1.

In the above-described output leakage current test, since a high-level signal is always outputted from the D flip-flop 61 provided in the internal circuit 4, it is possible to turn OFF the MOS transistors 21 and 22 provided in the output circuit 2 regardless of the output from the D flip-flop 51 provided in the internal circuit 4. Thus, in this state, the signals PTEST and NTEST may be at a high or a low level. For example, the signals PTEST and NTEST to be inputted to the state control circuit 5 may be fixed to a low level, so as to make the set control circuit 52 and the reset control circuit 53 output a high level signal.

An Example of the Configuration of the Three-State Control Circuit

An example of the circuit configuration of the three-state control circuit 3 in the semiconductor device that is shown in FIG. 1 and operates in the manner as described above will be described with reference to the circuit diagram shown in FIG. 4.

Figure 4:
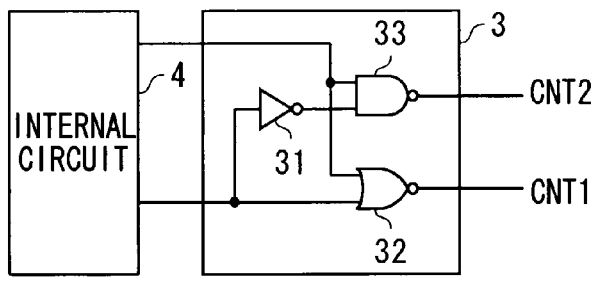
FIG. 4 is a circuit diagram showing an example of the configuration of a three-state control circuit provided in the semiconductor device of FIG. 1.

The three-state control circuit 3 shown in FIG. 4 is composed of: an inverter (an INV circuit) 31 whose input side is connected to the Q terminal of the D flip-flop 61 provided in the internal circuit 4; a NOR circuit 32 having two inputs, of which one is connected to the Q terminal of the D flip-flop 51 and the other is connected to the Q terminal of the D flip-flop 61, the D flip-flops 51 and 61 being provided in the internal circuit 4; and a NAND circuit 33 having two inputs, of which one is connected to the output side of the INV circuit 31 and the other is connected to the Q terminal of the D flip-flop 51 provided in the internal circuit 4.

The output side of the NOR circuit 32 is connected to the gate of the MOS transistor 21 of the output circuit 2, and the output side of the NAND circuit 33 is connected to the gate of the MOS transistor 22 of the output circuit 2. That is, the control signal CNT1 is outputted from the NOR circuit 32, and the control signal CNT2 is outputted from the NAND circuit 33.

As a result of the three-state control circuit 3 being configured as shown in FIG. 4, when a high-level signal is outputted from the D flip-flop 61 provided in the internal circuit 4, the high-level signal is fed to the INV circuit 31 and to the NOR circuit 32. In this case, the inputted high-level signal is inverted by the INV circuit 31, and the resultant low-level signal is fed to the NAND circuit 33. Thus, a low-level signal is outputted from the NOR circuit 32 and a high-level signal is outputted from the NAND circuit 33, and accordingly the control signals CNT1 and CNT2 outputted to the output circuit 2 turn to a low level and a high level, respectively. This turns off the MOS transistors 21 and 22 of the output circuit 2.

When a low-level signal is outputted from the D flip-flop 61 provided in the internal circuit 4, the low-level signal is fed to the input side of the INV circuit 31 and to one input of the NOR circuit 32. In this case, the inputted low-level signal is inverted by the INV circuit 31, and the resultant high-level signal is fed to one input of the NAND circuit 33.

At this time, if a low-level signal is outputted from the D flip-flop 51 provided in the internal circuit 4, the low-level signal is inputted to the other inputs of the NOR circuit 32 and the NAND circuit 33. Thus, since both the two inputs of the NOR circuit 32 are low, the output of the NOR circuit 32 turns to a high level. Furthermore, since one input of the NAND circuit 33 is high and the other low, the output of the NAND circuit 33 turns to a high level. As a result, both the control signals CNT1 and CNT2 to be outputted to the output circuit 2 turn to a high level. This turns on the MOS transistor 21 and off the MOS transistor 22 in the output circuit 2.

Alternatively, if a high-level signal is outputted from the D flip-flop 51 provided in the internal circuit 4, the high-level signal is inputted to the other inputs of the NOR circuit 32 and the NAND circuit 33. Thus, since one input of the NOR circuit 32 is high and the other low, the output of the NOR circuit 32 turns to a low level. Furthermore, since both the two inputs of the NAND circuit 33 are high, the output of the NAND circuit 33 turns to a low level. As a result, both the control signals CNT1 and CNT2 to be outputted to the output circuit 2 turn to a low level. This turns on the MOS transistor 22 and off the MOS transistor 21 in the output circuit 2.

It is to be understood that the circuit configuration of the three-state control circuit 3 shown in FIG. 4 is given merely as an example. The three-state control circuit 3 may be built with any other logic elements as long as the logic state is changed in the manner as described above based on the outputs from the D flip-flops 51 and 61 provided in the internal circuit 4.

An Example of the Configuration of the State Control Circuit

Next, an example of the circuit configuration of the state control circuits 5 and 6 in the semiconductor device that is shown in FIG. 1 and operates in the manner as described above will be described with reference to the circuit diagram shown in FIG. 5.

1. The Set Control Circuit 52 of the State Control Circuit 5

Figure 5:
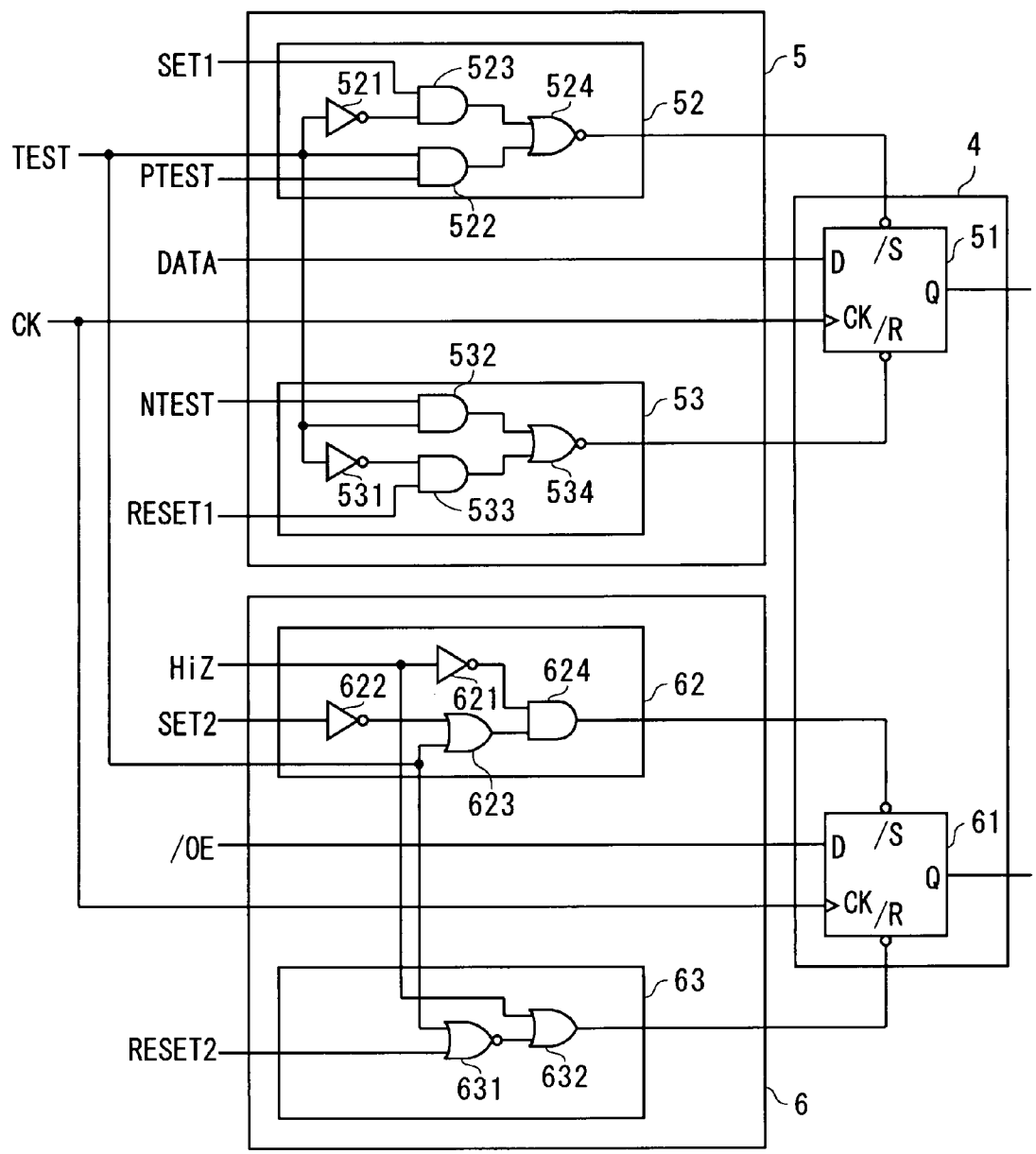
FIG. 5 is a circuit diagram showing an example of the configuration of the state control circuit shown in FIG. 3.
Figure 6:
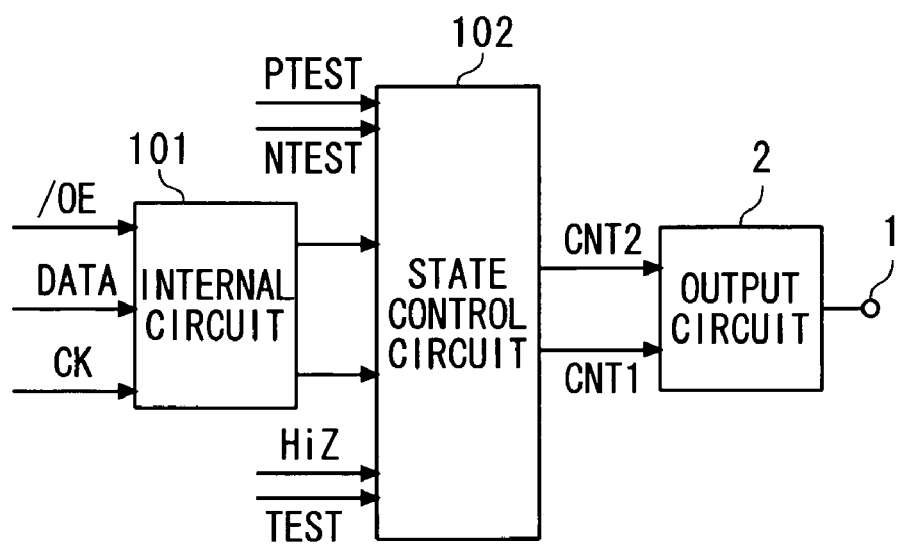
FIG. 6 is a block diagram showing the internal configuration of a conventional semiconductor device.

As shown in FIG. 5, the set control circuit 52 is composed of: an INV circuit 521 to which the signal TEST is inputted, an AND circuit 522 to which the signals TEST and PTEST are inputted, an AND circuit 523 to which an output of the INV circuit 521 and a signal SET1 are inputted, and a NOR circuit 524 to which the outputs of the AND circuits 522 and 523 are inputted. The output of the NOR circuit 524 is connected to the /S terminal of the D flip-flop 51 provided in the internal circuit 4. Here, the signal SET1 is a signal for setting the D flip-flop 51; when the signal SET1 turns to a high level, the D flip-flop 51 is set and the output from the Q terminal thereof is forced high.

With the set control circuit 52 configured as described above, when the signal TEST is turned high, a low-level signal is inputted to the AND circuit 523 from the INV circuit 521. Thus, regardless of the level of the signal SET1, the output of the AND circuit 523 turns to a low level. On the other hand, as for the AND circuit 522, since one input thereof is a high-level signal TEST, the AND circuit 522 outputs the same level as that of the signal PTEST, which is the other input thereof. As for the NOR circuit 524, since one input thereof, namely the output from the AND circuit 523, is low, the NOR circuit 524 outputs a level obtained by inverting the other input thereof, namely the output from the AND circuit 522, to the /S terminal of the D flip-flop 51 provided in the internal circuit 4. Thus, at this point, if the signal PTEST is turned high, a low level is inputted to the /S terminal of the D flip-flop 51; if the signal PTEST is turned low, a high level is inputted to the /S terminal of the D flip-flop 51.

On the other hand, when the signal TEST is turned low, the low-level signal TEST is inputted to the AND circuit 522. Thus, regardless of the level of the signal PTEST, the output of the AND circuit 522 turns to a low level. As for the AND circuit 523, since a high-level signal is inputted to one input thereof from the INV circuit 521, the AND circuit 523 outputs the same level as that of the signal SET1, which is the other input thereof. As for the NOR circuit 524, since one input thereof, namely the output from the AND circuit 522, is low, the NOR circuit 524 outputs a level obtained by inverting the other input thereof, namely the output from the AND circuit 523, to the /S terminal of the D flip-flop 51 provided in the internal circuit 4. Thus, at this point, if the signal SET1 is turned high, a low level is inputted to the /S terminal of the D flip-flop 51; if the signal SET1 is turned low, a high level is inputted to the /S terminal of the D flip-flop 51.

2. The Reset Control Circuit 53 of the State Control Circuit 5

As shown in FIG. 5, the reset control circuit 53 is composed of: an INV circuit 531 to which the signal TEST is inputted; an AND circuit 532 to which the signals TEST and NTEST are inputted; an AND circuit 533 to which an output of the INV circuit 531 and a signal RESET1 are inputted; and a NOR circuit 534 to which the outputs of the AND circuits 532 and 533 are inputted. The output of the NOR circuit 534 is connected to the /R terminal of the D flip-flop 51 provided in the internal circuit 4. Here, the signal RESET1 is a signal for resetting the D flip-flop 51; when the signal RESET1 turns to a high level, the D flip-flop 51 is reset and the output from the Q terminal thereof is forced low.

With the reset control circuit 53 configured as described above, when the signal TEST is turned high, a low-level signal is inputted to the AND circuit 533 from the INV circuit 531. Thus, regardless of the level of the signal RESET1, the output of the AND circuit 533 turns to a low level. On the other hand, as for the AND circuit 532, since one input thereof is a high-level signal TEST, the AND circuit 532 outputs the same level as that of the signal NTEST, which is the other input thereof. As for the NOR circuit 534, since one input thereof, namely the output from the AND circuit 533, is low, the NOR circuit 534 outputs a level obtained by inverting the other input thereof, namely the output from the AND circuit 532, to the /R terminal of the D flip-flop 51 provided in the internal circuit 4. Thus, at this point, if the signal NTEST is turned high, a low level is inputted to the /R terminal of the D flip-flop 51; if the signal NTEST is turned low, a high level is inputted to the /R terminal of the D flip-flop 51.

On the other hand, when the signal TEST is turned low, the low-level signal TEST is inputted to the AND circuit 532. Thus, regardless of the level of the signal NTEST, the output of the AND circuit 532 turns to a low level. As for the AND circuit 533, since a high-level signal is inputted to one input thereof from the INV circuit 531, the AND circuit 533 outputs the same level as that of the signal RESET1, which is the other input thereof. As for the NOR circuit 534, since one input thereof, namely the output from the AND circuit 532, is low, the NOR circuit 534 outputs a level obtained by inverting the other input thereof, namely the output from the AND circuit 533, to the /R terminal of the D flip-flop 51 provided in the internal circuit 4. Thus, at this point, if the signal RESET1 is turned high, a low level is inputted to the /R terminal of the D flip-flop 51; if the signal RESET1 is turned low, a high level is inputted to the /R terminal of the D flip-flop 51.

3. The Set Control Circuit 62 of the State Control Circuit 6

As shown in FIG. 5, the set control circuit 62 is composed of: an INV circuit 621 to which the signal HiZ is inputted; an INV circuit 622 to which a signal SET2 is inputted; an OR circuit 623 to which an output of the INV circuit 622 and the signal TEST are inputted; and an AND circuit 624 to which the outputs of the INV circuit 621 and the OR circuit 623 are inputted. The output of the AND circuit 624 is connected to the /S terminal of the D flip-flop 61 provided in the internal circuit 4. Here, the signal SET2 is a signal for setting the D flip-flop 61; when the signal SET2 turns to a high level, the D flip-flop 61 is set and the output from the Q terminal thereof is forced high.

With the set control circuit 52 configured as described above, when the signal TEST is turned high, the high-level signal TEST is inputted to the OR circuit 623. Thus, regardless of the level of the signal SET2, the output of the OR circuit 623 turns to a high level. On the other hand, as for the AND circuit 624, since one input thereof is a high-level output of the OR circuit 623, the AND circuit 624 outputs the same level as that of the signal HiZ inverted by the INV circuit 621, which is the other input thereof, to the /S terminal of the D flip-flop 61 provided in the internal circuit 4. Thus, at this point, if the signal HiZ is turned high, a low level is inputted to the /S terminal of the D flip-flop 61; if the signal HiZ is turned low, a high level is inputted to the /S terminal of the D flip-flop 61.

On the other hand, when the signal TEST is turned low, the low-level signal TEST is inputted to the OR circuit 623. Thus, the OR circuit 623 outputs, as it is, the level of the signal SET2 inverted by the INV circuit 622. As for the AND circuit 624, one input thereof is the signal HiZ inverted by the INV circuit 621 and the other input thereof is the output of the OR circuit 623. Thus, at this point, if both the signals HiZ and SET2 are turned low, a high level is inputted to the /S terminal of the D flip-flop 61 provided in the internal circuit 4; if the signals HiZ and SET2 are turned low and high, respectively, a low level is inputted to the /S terminal of the D flip-flop 61.

4. The Reset Control Circuit 63 of the State Control Circuit 6

As shown in FIG. 5, the reset control circuit 63 is composed of: a NOR circuit 631 to which the signals TEST and RESET2 are inputted; and an OR circuit 632 to which an output of the NOR circuit 631 and the signal HiZ are inputted. The output of the OR circuit 632 is connected to the /R terminal of the D flip-flop 61 provided in the internal circuit 4. Here, the signal RESET2 is a signal for resetting the D flip-flop 61; when the signal RESET2 turns to a high level, the D flip-flop 61 is reset and the output from the Q terminal thereof is forced low.

With the reset control circuit 63 configured as described above, when the signal TEST is turned high, the high-level signal TEST is inputted to the NOR circuit 631. Thus, regardless of the level of the signal RESET2, the output of the NOR circuit 631 turns to a low level. On the other hand, as for the OR circuit 632, since one input thereof is a high-level output of the NOR circuit 631, the OR circuit 632 outputs the same level as that of the signal HiZ, which is the other input thereof, to the /R terminal of the D flip-flop 61 provided in the internal circuit 4. Thus, at this point, if the signal HiZ is turned high, a high level is inputted to the /R terminal of the D flip-flop 61; if the signal HiZ is turned low, a low level is inputted to the /R terminal of the D flip-flop 61.

On the other hand, when the signal TEST is turned low, the low-level signal TEST is inputted to the NOR circuit 631. Thus, the level of the signal RESET2 is inverted and is then outputted as an output of the NOR circuit 631. As for the OR circuit 632, one input thereof is the output of the NOR circuit 631 and the other input thereof is the signal HiZ. Thus, at this point, if both the signals HiZ and RESET2 are turned low, a high level is inputted to the /R terminal of the D flip-flop 61 provided in the internal circuit 4; if the signals HiZ and RESET2 are turned low and high, respectively, a low level is inputted to the /R terminal of the D flip-flop 51.

It is to be understood that the circuit configuration of the state control circuits 5 and 6 shown in FIG. 5 is given merely as an example. The state control circuits 5 and 6 may be built with any other logic elements as long as the logic state is changed in the manner as described above based on the states of the signals TEST, PTEST, NTEST, and HiZ. Alternatively, the circuit configuration may be modified in such way that the logic state is changed only by the signals TEST, PTEST, NTEST, and HiZ without the use of the signals SET1 and RESET1 to be inputted to the state control circuit 5 and the signals SET2 and RESET2 to be inputted to the state control circuit 6.

In the semiconductor device configured as described in this embodiment, since the D flip-flops 51 and 61 are provided in the internal circuit 4, it is simply necessary to use only the three-state control circuit 3 as a logic gate provided in a stage preceding the output circuit 2. This helps reduce the number of stages in which delay is produced. Although the descriptions heretofore deal with an example in which a signal obtained by combining the signals TEST and PTEST is inputted to the /S terminal of the D flip-flop 51 provided in the internal circuit 4 and a signal obtained by combining the signals TEST and NTEST is inputted to the /R terminal thereof, it is also possible to input the signals PTEST and NTEST to the /S terminal and to the /R terminal, respectively, without combining them with other signals. Likewise, although the descriptions heretofore deal with an example in which a signal obtained by combining the signals TEST and HiZ is inputted to the /S terminal and the /R terminal of the D flip-flop 61 provided in the internal circuit 4, it is also possible to input the signals TEST and HiZ separately to the /S terminal and to the /R terminal without combining them.

Semiconductor devices according to the present invention can be applied as semiconductor devices such as microcomputers that perform high-speed data processing in communication apparatus or the like.

What is claimed is:

1. A semiconductor device comprising:
   an output circuit that is built with a first switching element and a second switching element that are connected in series between a first direct-current voltage and a second direct-current voltage;
   an output terminal that is connected to a node at which the first and second switching elements are connected together;
   an internal circuit that produces data in a form of binary data that shifts between a first signal level and a second signal level;
   a first control circuit that performs switching control of the first and second switching elements of the output circuit according to the data inputted from the internal circuit; and
   a second control circuit to which a first control signal by which only the first switching element is forced ON by the first control circuit and a second control signal by which only the second switching element is forced ON by the first control circuit are inputted, the second control circuit that forcedly sets, according to the first and second control signals, a signal level of the data to be outputted from the internal circuit,
   wherein, when the data is at the first signal level, the first switching element is turned ON and the first direct-current voltage appears at the output terminal,
   wherein, when the data is at the second signal level, the second switching element is turned ON and the second direct-current voltage appears at the output terminal,
   wherein, when the first control signal is inputted to the second control circuit, the data that has been forced to be at the first signal level is outputted from the internal circuit to the first control circuit,
   wherein, when the second control signal is inputted to the second control circuit, the data that has been forced to be at the second signal level is outputted from the internal circuit to the first control circuit.

2. A semiconductor device comprising:
   an output circuit that is built with a first switching element and a second switching element that are connected in series between a first direct-current voltage and a second direct-current voltage;
   an output terminal that is connected to a node at which the first and second switching elements are connected together;
   an internal circuit that produces data in a form of binary data that shifts between a first signal level and a second signal level;
   a first control circuit that performs switching control of the first and second switching elements of the output circuit according to the data inputted from the internal circuit; and
   a second control circuit to which a first control signal by which only the first switching element is forced ON by the first control circuit and a second control signal by which only the second switching element is forced ON by the first control circuit are inputted, the second control circuit that forcedly sets, according to the first and second control signals, a signal level of the data to be outputted from the internal circuit;
   wherein, when the data is at the first signal level, the first switching element is turned ON and the first direct-current voltage appears at the output terminal,
   wherein, when the data is at the second signal level, the second switching element is turned ON and the second direct-current voltage appears at the output terminal,
   wherein, when the first control signal is inputted to the second control circuit, the data that has been forced to be at the first signal level is outputted from the internal circuit to the first control circuit,
   wherein, when the second control signal is inputted to the second control circuit, the data that has been forced to be at the second signal level is outputted from the internal circuit to the first control circuit,
   wherein the internal circuit comprises a first flip-flop that outputs the data to the first control circuit,
   wherein the first flip-flop comprises:
      an input terminal to which the data is inputted;
      an output terminal that produces an output to the first control circuit;
      a first control terminal that forcedly sets, upon receiving a signal from the second control circuit to which the first control signal is inputted, a level of the output terminal at the first signal level; and
      a second control terminal that forcedly sets, upon receiving a signal from the second control circuit to which the second control signal is inputted, a level of the output terminal at the second signal level.

3. The semiconductor device of claim 2, wherein the second control circuit comprises:
   a first logic gate that gives permission for the first control signal inputted thereto to be inputted to the first control terminal of the first flip-flop; and
   a second logic gate that gives permission for the second control signal inputted thereto to be inputted to the second control terminal of the first flip-flop.

4. The semiconductor device of claim 3, wherein
a third control signal for setting the permission given by the first and second logic gates to input the first and second control signals is inputted to the first and second logic gates.

5. A semiconductor device comprising:
an output circuit that is built with a first switching element and a second switching element that are connected in series between a first direct-current voltage and a second direct-current voltage;
an output terminal that is connected to a node at which the first and second switching elements are connected together;
an internal circuit that produces data in a form of binary data that shifts between a first signal level and a second signal level;
a first control circuit that performs switching control of the first and second switching elements of the output circuit according to the data inputted from the internal circuit; and
a second control circuit to which a first control signal by which only the first switching element is forced ON by the first control circuit and a second control signal by which only the second switching element is forced ON by the first control circuit are inputted, the second control circuit that forcedly sets, according to the first and second control signals, a signal level of the data to be outputted from the internal circuit,
wherein, when the data is at the first signal level, the first switching element is turned ON and the first direct-current voltage appears at the output terminal,
wherein, when the data is at the second signal level, the second switching element is turned ON and the second direct-current voltage appears at the output terminal,
wherein, when the first control signal is inputted to the second control circuit, the data that has been forced to be at the first signal level is outputted from the internal circuit to the first control circuit,
wherein, when the second control signal is inputted to the second control circuit, the data that has been forced to be at the second signal level is outputted from the internal circuit to the first control circuit,
a third control circuit that gives an instruction, upon receiving a fifth control signal by which a driving of the output circuit is forcedly inhibited by the first control circuit, to the internal circuit based on the fifth control signal thus received,
wherein a fourth control signal for enabling and disabling the driving of the output circuit is outputted from the internal circuit to the first control circuit,
wherein, when the fifth control signal is inputted, the third control circuit instructs the internal circuit to switch a level of the fourth control signal to be outputted to the first control circuit to a level at which the driving of the output circuit is disabled.

6. The semiconductor device of claim 5,
wherein the internal circuit comprises a second flip-flop that outputs the fourth control signal to the first control circuit,
wherein the second flip-flop comprises:
an input terminal to which the fourth control signal is inputted;
an output terminal that produces an output to the first control circuit; and
a control terminal that forcedly sets, upon receiving a signal from the third control circuit to which the fifth control signal is inputted, a level of the output terminal to a predetermined level at which the driving of the output circuit is forcedly inhibited.

7. The semiconductor device of claim 6, wherein
the third control circuit comprises a third logic gate that gives permission for the fifth control signal inputted thereto to be inputted to the control terminal of the second flip-flop.

8. The semiconductor device of claim 7, wherein
a third control signal for setting the permission given by the third logic gate to input the fifth control signal is inputted to the third logic gate.

9. The semiconductor device of claim 5,
wherein the first control circuit is a three-state control circuit that perform switching between a data output state in which one of the first and second switching elements is turned ON according to the data from the internal circuit and a floating state in which the first and second switching elements are both turned OFF,
wherein, when the first control circuit is fed from the internal circuit with the fourth control signal at a signal level at which the driving of the output circuit is disabled, the first control circuit performs switching to the floating state, so that the first and second switching elements are turned OFF regardless of the signal level of the data outputted from the internal circuit,
wherein, when the first control circuit is fed from the internal circuit with the fourth control signal at a signal level at which the driving of the output circuit is enabled, the first control circuit performs switching to the data output state, so that ON/OFF switching of the first and second switching elements is performed according to the signal level of the data outputted from the internal circuit.

10. The semiconductor device of claim 9,
wherein the internal circuit comprises a second flip-flop that outputs the fourth control signal to the first control circuit,
wherein the second flip-flop comprises:
an input terminal to which the fourth control signal is inputted;
an output terminal that produces an output to the first control circuit; and
a control terminal that forcedly sets, upon receiving a signal from the third control circuit to which the fifth control signal is inputted, a level of the output terminal to a predetermined level at which the driving of the output circuit is forcedly inhibited.

11. The semiconductor device of claim 10, wherein
the third control circuit comprises a third logic gate that gives permission for the fifth control signal inputted thereto to be inputted to the control terminal of the second flip-flop.

12. The semiconductor device of claim 11, wherein
a third control signal for setting the permission given by the third logic gate to input the fifth control signal is inputted to the third logic gate.

* * * * *